(12) United States Patent
Chen et al.

(10) Patent No.: US 12,356,348 B2
(45) Date of Patent: Jul. 8, 2025

(54) CLOCK SYNCHRONIZATION CIRCUIT, CONTROL METHOD, PRINTED CIRCUIT BOARD AND COMMUNICATION DEVICE

(71) Applicant: ZTE CORPORATION, Shenzhen (CN)

(72) Inventors: Song Chen, Shenzhen (CN); Xuelin Li, Shenzhen (CN); Yenan Bie, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 338 days.

(21) Appl. No.: 18/247,933

(22) PCT Filed: Jul. 19, 2021

(86) PCT No.: PCT/CN2021/107142
§ 371 (c)(1),
(2) Date: Apr. 5, 2023

(87) PCT Pub. No.: WO2022/077987
PCT Pub. Date: Apr. 21, 2022

(65) Prior Publication Data
US 2023/0379846 A1    Nov. 23, 2023

(30) Foreign Application Priority Data
Oct. 12, 2020 (CN) .......................... 202011084401.1

(51) Int. Cl.
*H04W 56/00* (2009.01)
(52) U.S. Cl.
CPC ................ *H04W 56/001* (2013.01)

(58) Field of Classification Search
CPC .......... H04W 56/001; H03L 7/08; H03L 7/18; H03L 7/093
See application file for complete search history.

(56) References Cited

U.S. PATENT DOCUMENTS

| 4,135,166 | A  | 1/1979  | Marchetti |
| 5,519,887 | A  | 5/1996  | Lieu |
| 6,538,518 | B1 | 3/2003  | Chengson |
| 6,687,320 | B1 | 2/2004  | Chiu et al. |
| 2006/0220694 | A1 | 10/2006 | Watanabe |
| 2010/0277210 | A1 | 11/2010 | Wang et al. |

(Continued)

FOREIGN PATENT DOCUMENTS

| CN | 101420294 A | 4/2009 |
| CN | 107305405 A | 10/2017 |
| EP | 2525494 B1 | 9/2017 |

OTHER PUBLICATIONS

European Patent Office. Extended European Search Report for EP Application No. 21879034.3, mailed Feb. 15, 2024, pp. 1-11.

(Continued)

*Primary Examiner* — Kyaw Z Soe
(74) *Attorney, Agent, or Firm* — Vivacqua Crane, PLLC

(57) ABSTRACT

Disclosed are a clock synchronization circuit, a control method, a printed circuit board and a communication device. The clock synchronization circuit includes an external reference signal processing module, a phase detector, a voltage control conversion module, a clock generator, and a first frequency divider.

13 Claims, 4 Drawing Sheets

(56) References Cited

U.S. PATENT DOCUMENTS

2022/0294458 A1\* 9/2022 Han ........................ H03L 7/093

OTHER PUBLICATIONS

International Searching Authority. International Search Report and Written Opinion for PCT Application No. PCT/CN2021/107142 and English translation, mailed Oct. 20, 2021, pp. 1-10.
The State Intellectual Property Office of People's Republic of China. First Office Action and Search Report for CN Application No. 202011084401.1 and English translation, mailed Apr. 24, 2025, pp. 1-37.

\* cited by examiner

CLOCK SYNCHRONIZATION CIRCUIT, CONTROL METHOD, PRINTED CIRCUIT BOARD AND COMMUNICATION DEVICE

CROSS-REFERENCE TO RELATED APPLICATION

This application is a national stage filing under 35 U.S.C. § 371 of international application No. PCT/CN2021/107142, filed Jul. 19, 2021, which claims priority to Chinese patent application No. 202011084401.1, filed Oct. 12, 2020. The contents of these applications are incorporated herein by reference in their entirety.

TECHNICAL FIELD

The present disclosure relates to the field of communication circuits, and in particular, to a clock synchronization circuit, a control method, a printed circuit board, and a communication device.

BACKGROUND

Communication devices such as base stations and radio frequency test meters need to synchronize internal or external reference clocks in different application scenarios. A radio frequency communication device has an internal reference clock source, that is, the internal reference clock. When the internal reference clock needs to be synchronized, a clock system is synchronized to the internal reference clock. When the external reference clock needs to be synchronized, the clock system is synchronized to the external reference clock through internal switching and software configuration update. Therefore, these devices have corresponding synchronous internal and external reference clock circuits. The scheme of internal and external reference clock circuits of conventional communication devices is simple in principle, but also has some shortcomings. For example, at least two clock generator devices are needed, which occupies a large area of a printed circuit board and leads to a high total cost.

SUMMARY

The following is an overview of the subject matter described in detail herein. This summary is not intended to limit the protection scope of the claims.

Embodiments of the present disclosure provide a clock synchronization circuit, a control method, a printed circuit board, and a communication device.

In accordance with a first aspect of the present disclosure, an embodiment provides a clock synchronization circuit. The clock synchronization circuit includes an external reference signal processing module, a phase detector, a voltage control conversion module, a clock generator, and a first frequency divider. The external reference signal processing module is provided with a reference signal input terminal and a reference signal output terminal. The phase detector is provided with a phase detection reference signal input terminal, a phase detection output terminal and a phase detection feedback terminal, the phase detection reference signal input terminal being connected to the reference signal output terminal, The voltage control conversion module includes a digital-to-analog converter, a loop filtering module and a first switch module, the first switch module being provided with a first switch input terminal, a second switch input terminal and a first switch output terminal, the digital-to-analog converter being connected to the first switch input terminal, and the phase detection output terminal being connected to the second switch input terminal by means of the loop filtering module. The clock generator is provided with a control voltage input terminal, a clock frequency output terminal and a clock frequency feedback terminal, the first switch output terminal being connected to the control voltage input terminal. The clock frequency feedback terminal is connected to the phase detection feedback terminal by means of the first frequency divider.

In accordance with a second aspect of the present disclosure, an embodiment provides a control method for a clock synchronization circuit. The clock synchronization circuit including an external reference signal processing module, a phase detector, a voltage control conversion module, a clock generator, and a first frequency divider. The voltage control conversion module includes a digital-to-analog converter, a loop filtering module, and a first switch module. The external reference signal processing module, the phase detector, the loop filtering module, the first switch module, and the clock generator are sequentially connected. The digital-to-analog converter is connected to the first switch module, and the clock generator is further connected to the phase detector by means of the first frequency divider. The control method including: controlling the first switch module to switch, so that a signal from the digital-to-analog converter or a signal from the external reference signal processing module is transmitted to the clock generator by means of the first switch module, to realize synchronization of an internal reference clock or an external reference clock.

In accordance with a third aspect of the present disclosure, an embodiment provides a printed circuit board. The printed circuit board includes the clock synchronization circuit in the embodiment according to the first aspect of the present disclosure.

In accordance with a further aspect of the present disclosure, an embodiment provides a communication device. The device includes the clock synchronization circuit in the embodiment according to the first aspect of the present disclosure or includes the printed circuit board in the embodiment according to the third aspect of the present disclosure.

According to embodiments of the present disclosure, a clock synchronization circuit, a control method for a clock synchronization circuit, a printed circuit board, and a communication device are provided. When the internal reference clock needs to be synchronized, the first switch module is controlled to switch to be communicated with the digital-to-analog converter and the control voltage input terminal of the clock generator. The digital-to-analog converter can output a control voltage corresponding to the internal reference clock to the clock generator to control an output frequency of the clock generator. When the external reference clock needs to be synchronized, the first switch module is controlled to switch to be communicated with the loop filtering module and the control voltage input terminal of the clock generator. An external reference clock signal enters the external reference signal processing module from the reference signal input terminal and is transmitted from the reference signal output terminal to the phase detection reference signal input terminal of the phase detector. The phase detector, the loop filtering module, the clock generator, and the first frequency divider form a phase locked loop. The output frequency of the clock generator is transmitted from the clock frequency feedback terminal to the first frequency divider, then transmitted to the phase detection feedback terminal of the phase detector after frequency division, and then phase-detected with the external reference clock signal at the phase detection reference signal input terminal. A charge pump inside the phase detector outputs a voltage error signal from the phase detection output terminal, the loop filtering module filters an alternating-current component of the voltage error signal to obtain a control voltage, which is transmitted from the control voltage input terminal to the clock generator to control the output frequency of the clock generator. The internal and external reference clocks can be switched with fewer clock generator devices, thereby reducing an area of the printed circuit board and saving costs.

BRIEF DESCRIPTION OF DRAWINGS

The accompanying drawings are intended to provide a further understanding of the present disclosure, and constitute a part of the description. In addition, the accompanying drawings are used to illustrate the present disclosure in conjunction with embodiments of the present disclosure, and do not constitute limitations on the technical schemes of the present disclosure.

DETAILED DESCRIPTION

In order to make the objectives, technical schemes, and advantages of the present disclosure clear, the present disclosure is described in further detail below in conjunction with the accompanying drawings and embodiments. It should be understood that specific embodiments described herein are only used to illustrate the present disclosure, and are not intended to limit the present disclosure.

It is to be noted, although functional modules have been divided in the schematic diagrams of apparatuses and logical orders have been shown in the flowcharts, in some cases, the modules may be divided in a different manner, or the steps shown or described may be executed in an order different from the orders as shown in the flowcharts. The terms such as "first", "second" and the like in the description, the claims, and the accompanying drawings are used to distinguish similar objects, and are not necessarily used to describe a specific sequence or a precedence order.

According to embodiments of the present disclosure, a clock synchronization circuit, a control method, a printed circuit board, and a communication device are provided, which can realize switching of internal and external reference clocks with fewer clock generator devices, thereby reducing an area of the printed circuit board and saving costs.

Embodiments of the present disclosure are further elaborated below with reference to the accompanying drawings.

Figure 1:
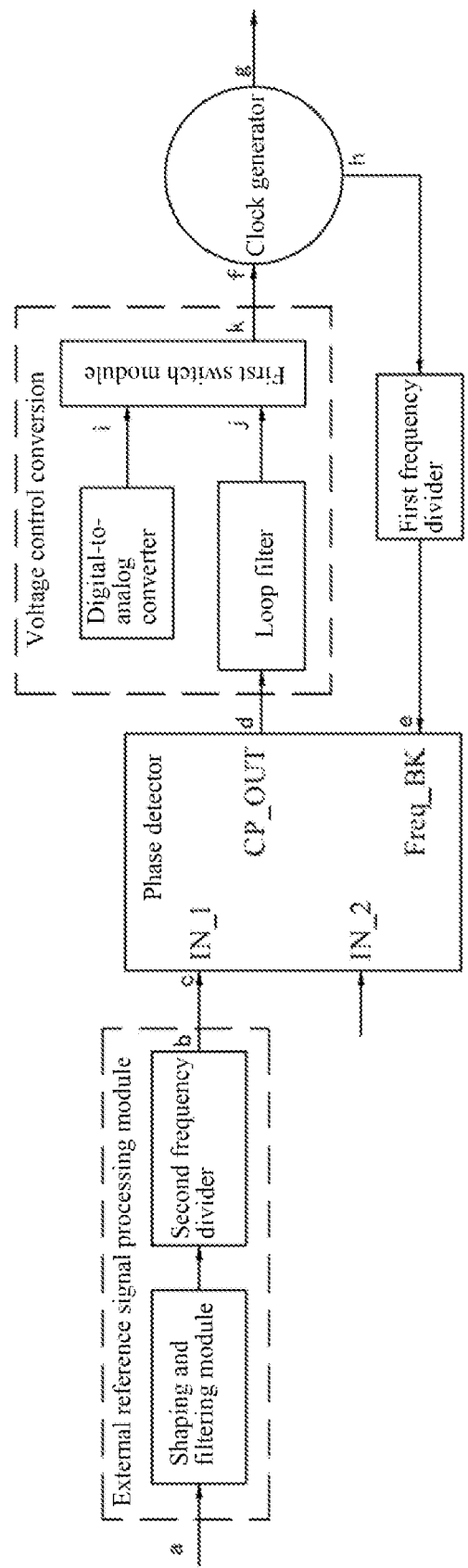
FIG. 1 is a schematic circuit diagram of a clock synchronization circuit according to Embodiment one of the present disclosure.

FIG. 1 is a schematic circuit diagram of a clock synchronization circuit according to an embodiment of the present disclosure.

As shown in FIG. 1, the clock synchronization circuit includes an external reference signal processing module, a phase detector, a voltage control conversion module, a clock generator, and a first frequency divider.

The external reference signal processing module is provided with a reference signal input terminal a and a reference signal output terminal b. An external reference clock signal enters from the reference signal input terminal a into the external reference signal processing module, and then is outputted from the reference signal output terminal b.

The phase detector is provided with a phase detection reference signal input terminal c, a phase detection output terminal d, and a phase detection feedback terminal e. The phase detection reference signal input terminal c is connected to the reference signal output terminal b.

The voltage control conversion module includes a digital-to-analog converter, a loop filtering module, and a first switch module. In this embodiment, the loop filtering module includes a loop filter, the first switch module is provided with a first switch input terminal i, a second switch input terminal j and a first switch output terminal k, the digital-to-analog converter is connected to the first switch input terminal i, and the phase detection output terminal d is connected to the second switch input terminal j by means of the loop filter.

The clock generator is provided with a control voltage input terminal f, a clock frequency output terminal g, and a clock frequency feedback terminal h, and the first switch output terminal k is connected to the control voltage input terminal f. The clock frequency feedback terminal h is connected to the phase detection feedback terminal e by means of the first frequency divider.

In this embodiment, when the internal reference clock needs to be synchronized, the first switch module is controlled to switch to be communicated with the digital-to-analog converter and the control voltage input terminal f of the clock generator, and the digital-to-analog converter can output a control voltage corresponding to the internal reference clock to the clock generator to control an output frequency of the clock generator. When the external reference clock needs to be synchronized, the first switch module is controlled to switch to be communicated with the loop filtering module and the control voltage input terminal f of the clock generator. An external reference clock signal enters the external reference signal processing module from the reference signal input terminal a and is transmitted from the reference signal output terminal b to the phase detection reference signal input terminal c of the phase detector. The phase detector, the loop filtering module, the clock generator, and the first frequency divider form a phase locked loop. In this case, the clock generator functions as a voltage-controlled oscillator. The output frequency of the clock generator is transmitted from the clock frequency feedback terminal h to the first frequency divider, then transmitted to the phase detection feedback terminal e of the phase detector after frequency division, and then phase-detected with the external reference clock signal at the phase detection reference signal input terminal c. A charge pump inside the phase detector outputs a voltage error signal from the phase detection output terminal d, and the loop filtering module filters an alternating-current component of the voltage error signal to obtain a control voltage, which is transmitted from the control voltage input terminal f to the clock generator to control the output frequency of the clock generator. The clock synchronization circuit can realize switching of the internal and external reference clocks with fewer clock generator devices, thereby reducing an area of the printed circuit board and saving costs.

Figure 2:
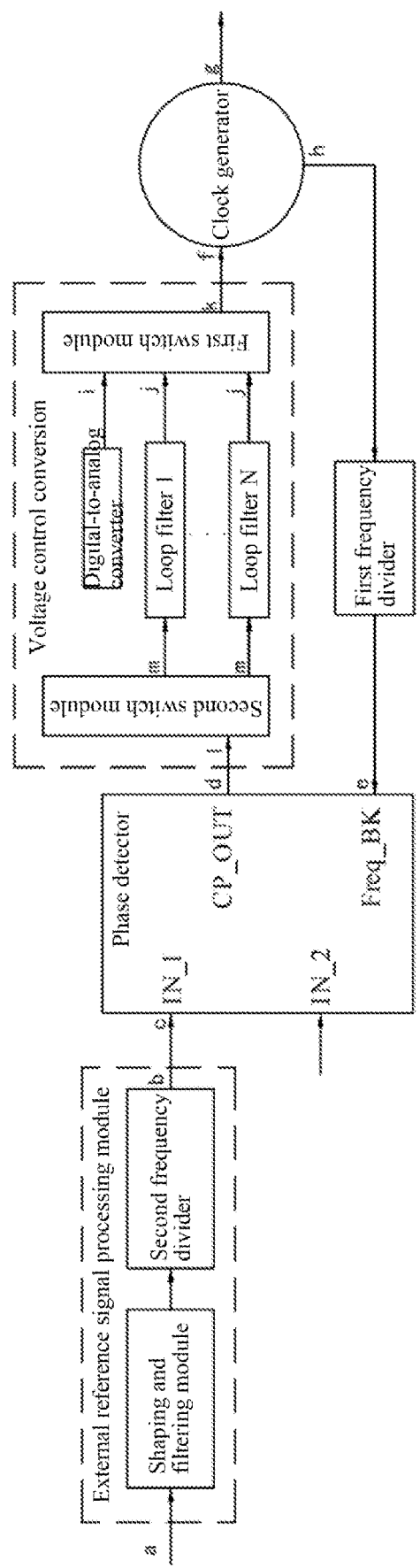
FIG. 2 is a schematic circuit diagram of a clock synchronization circuit according to Embodiment two of the present disclosure.

FIG. 2 is a schematic circuit diagram of a clock synchronization circuit according to another embodiment of the present disclosure.

As shown in FIG. 2, the clock synchronization circuit includes an external reference signal processing module, a phase detector, a voltage control conversion module, a clock generator, and a first frequency divider.

The external reference signal processing module is provided with a reference signal input terminal a and a reference signal output terminal b. An external reference clock signal enters from the reference signal input terminal a into the external reference signal processing module, and then is outputted from the reference signal output terminal b.

The phase detector is provided with a phase detection reference signal input terminal c, a phase detection output terminal d, and a phase detection feedback terminal e. The phase detection reference signal input terminal c is connected to the reference signal output terminal b.

The voltage control conversion module includes a second switch module, a digital-to-analog converter, a loop filtering module, and a first switch module. In this embodiment, the loop filtering module includes a plurality of loop filters, and the second switch module is provided with a third switch input terminal 1 and second switch output terminals m. The third switch input terminal 1 is connected to the phase detection output terminal d, and the number of the second switch output terminals m corresponds to the number of the loop filters. The first switch module is provided with a first switch input terminal i, second switch input terminals j and a first switch output terminal k, the digital-to-analog converter is connected to the first switch input terminal i, and the number of the second switch input terminals j corresponds to the number of the loop filters. Each second switch output terminal m is connected to one second switch input terminal j by means of one loop filter.

The clock generator is provided with a control voltage input terminal f, a clock frequency output terminal g, and a clock frequency feedback terminal h, and the first switch output terminal k is connected to the control voltage input terminal f. The clock frequency feedback terminal h is connected to the phase detection feedback terminal e by means of the first frequency divider.

In this embodiment, since the voltage control conversion module is provided with a plurality of loop filters, when the external reference clock needs to be synchronized, different loop filters may be selected by means of the first switch module and the second switch module to realize adjustable loop parameter hardware.

In addition, as shown in FIG. 2, in the clock synchronization circuit, the external reference signal processing module includes a shaping and filtering module and a second frequency divider which are sequentially connected, the reference signal input terminal a is connected to the shaping and filtering module, and the second frequency divider is connected to the reference signal output terminal b. An external reference clock signal enters from the reference signal input terminal a into the external reference signal processing module, passes through the shaping and filtering module for shaping and filtering, then passes through the second frequency divider for frequency division, and is finally transmitted from the reference signal output terminal b to the phase detection reference signal input terminal c of the phase detector.

Figure 3:
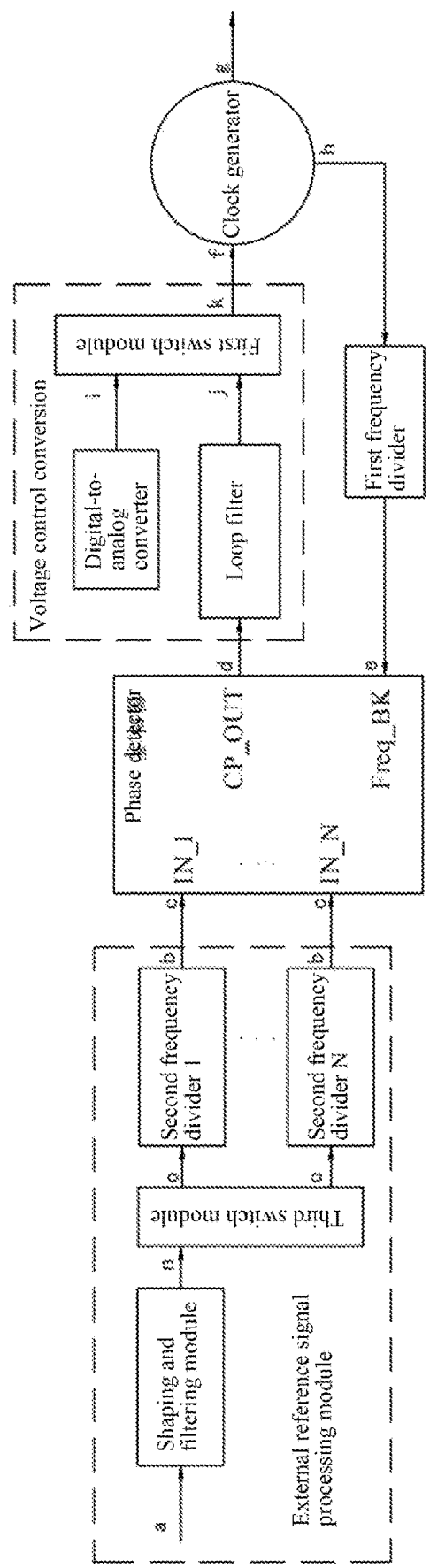
FIG. 3 is a schematic circuit diagram of a clock synchronization circuit according to Embodiment three of the present disclosure.

FIG. 3 is a schematic circuit diagram of a clock synchronization circuit according to another embodiment of the present disclosure.

As shown in FIG. 3, the clock synchronization circuit includes an external reference signal processing module, a phase detector, a voltage control conversion module, a clock generator, and a first frequency divider.

The external reference signal processing module is provided with a reference signal input terminal a and a reference signal output terminal b. The external reference signal processing module includes a shaping and filtering module, a third switch module, and a plurality of second frequency dividers. The third switch module is provided with a fourth switch input terminal n and third switch output terminals o. The reference signal input terminal a is connected to the shaping and filtering module, an output terminal of the shaping and filtering module is connected to the fourth switch input terminal n, and the number of the third switch output terminals o corresponds to the number of the second frequency dividers. Each of the third switch output terminals o is connected to an input terminal of one of the second frequency dividers, and an output terminal of each of the second frequency dividers serves as the reference signal output terminal b. That is, the external reference signal processing module is provided with a plurality of reference signal output terminals b.

The phase detector is provided with a phase detection reference signal input terminal c, a phase detection output terminal d, and a phase detection feedback terminal e. There are provided a plurality of phase detection reference signal input terminals c. Each of the reference signal output terminals b is connected to one of the phase detection reference signal input terminals c.

The voltage control conversion module includes a digital-to-analog converter, a loop filtering module, and a first switch module. In this embodiment, the loop filtering module includes a loop filter, the first switch module is provided with a first switch input terminal i, a second switch input terminal j and a first switch output terminal k, the digital-to-analog converter is connected to the first switch input terminal i, and the phase detection output terminal d is connected to the second switch input terminal j by means of the loop filter.

The clock generator is provided with a control voltage input terminal f, a clock frequency output terminal g and a clock frequency feedback terminal h, and the first switch output terminal k is connected to the control voltage input terminal f. The clock frequency feedback terminal h is connected to the phase detection feedback terminal e by means of the first frequency divider.

In this embodiment, the external reference signal processing module is provided with the plurality of second frequency dividers and the third switch module, and the third switch module can be controlled to switch to select a most appropriate channel for the signal to enter the phase detection reference signal input terminal c of the phase detector. Therefore, a wider range of external reference frequencies can be synchronized.

Figure 4:
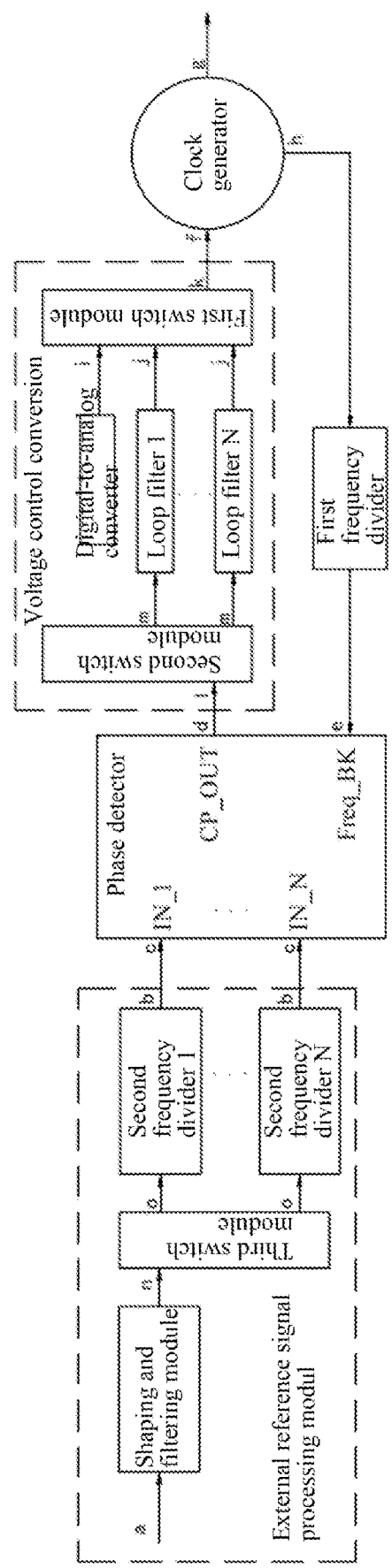
FIG. 4 is a schematic circuit diagram of a clock synchronization circuit according to Embodiment four of the present disclosure.

FIG. 4 is a schematic circuit diagram of a clock synchronization circuit according to yet another embodiment of the present disclosure.

As shown in FIG. 4, the clock synchronization circuit includes an external reference signal processing module, a phase detector, a voltage control conversion module, a clock generator, and a first frequency divider.

The external reference signal processing module is provided with a reference signal input terminal a and a reference signal output terminal b. The external reference signal processing module includes a shaping and filtering module, a third switch module, and a plurality of second frequency dividers. The third switch module is provided with a fourth switch input terminal n and third switch output terminals o. The reference signal input terminal a is connected to the shaping and filtering module, an output terminal of the shaping and filtering module is connected to the fourth switch input terminal n, and the number of the third switch output terminals o corresponds to the number of the second frequency dividers. Each of the third switch output terminals o is connected to an input terminal of one of the second frequency dividers, and an output terminal of each of the second frequency dividers serves as the reference signal output terminal b. That is, the external reference signal processing module is provided with a plurality of reference signal output terminals b.

The phase detector is provided with a phase detection reference signal input terminal c, a phase detection output terminal d, and a phase detection feedback terminal e. There are provided a plurality of phase detection reference signal input terminals c. Each of the reference signal output terminals b is connected to one of the phase detection reference signal input terminals.

The voltage control conversion module includes a second switch module, a digital-to-analog converter, a loop filtering module, and a first switch module. In this embodiment, the loop filtering module includes a plurality of loop filters. The second switch module is provided with a third switch input terminal 1 and second switch output terminals m. The phase detection output terminal d is connected to the third switch input terminal 1, and the number of the second switch output terminals m corresponds to the number of the loop filters. The first switch module is provided with a first switch input terminal i, second switch input terminals j and a first switch output terminal k, the digital-to-analog converter is connected to the first switch input terminal i, and the number of the second switch input terminals j corresponds to the number of the loop filters. Each second switch output terminal m is connected to one second switch input terminal j by means of one loop filter.

The clock generator is provided with a control voltage input terminal f, a clock frequency output terminal g, and a clock frequency feedback terminal h, and the first switch output terminal k is connected to the control voltage input terminal f. The clock frequency feedback terminal h is connected to the phase detection feedback terminal e by means of the first frequency divider.

The clock synchronization circuit has the structural characteristics of both the clock synchronization circuit shown in FIG. 2 and the clock synchronization circuit shown in FIG. 3, and thus also has advantages of both the clock synchronization circuits shown in FIG. 2 and FIG. 3. That is, when the external reference clock needs to be synchronized, different loop filters can be selected by means of the first switch module and the second switch module to realize adjustable loop parameter hardware. Moreover, the third switch module can be controlled to switch to select a most appropriate channel for the signal to enter the phase detection reference signal input terminal c of the phase detector. Therefore, a wider range of external reference frequencies can be synchronized.

Embodiments of a control method for a clock synchronization circuit are provided below based on the clock synchronization circuit in the above embodiments.

According to the present disclosure, an embodiment provides a control method for a clock synchronization circuit.

As shown in FIG. 1, the clock synchronization circuit includes an external reference signal processing module, a phase detector, a voltage control conversion module, a clock generator, and a first frequency divider. The voltage control conversion module includes a digital-to-analog converter, a loop filtering module, and a first switch module. The external reference signal processing module, the phase detector, the loop filtering module, the first switch module, and the clock generator are sequentially connected. The digital-to-analog converter is connected to the first switch module, and the clock generator is further connected to the phase detector by means of the first frequency divider.

The control method includes:
controlling the first switch module to switch, so that a signal from the digital-to-analog converter or a signal from the external reference signal processing module is transmitted to the clock generator by means of the first switch module to realize synchronization of an internal reference clock or an external reference clock.

In an embodiment, when the internal reference clock needs to be synchronized, the control method includes:
controlling the first switch module to communicate with the digital-to-analog converter and the clock generator, so that the signal from the digital-to-analog converter is transmitted to the clock generator by means of the first switch module to realize synchronization of the internal reference clock.

The first switch module is controlled to communicate with the digital-to-analog converter and the clock generator, and the digital-to-analog converter can output a control voltage corresponding to the internal reference clock to the clock generator to control an output frequency of the clock generator to realize synchronization of the internal reference clock.

In an embodiment, when the external reference clock needs to be synchronized, the control method includes:
controlling the first switch module to communicate with the loop filtering module and the clock generator, so that the signal from the external reference signal processing module is transmitted to the clock generator by means of the first switch module to realize synchronization of the external reference clock.

The first switch module is controlled to switch to communicate with the loop filtering module and the clock generator. An external reference clock signal enters the external reference signal processing module from the reference signal input terminal a and is transmitted from the reference signal output terminal b to the phase detection reference signal input terminal c of the phase detector. The phase detector, the loop filtering module, the clock generator, and the first frequency divider form a phase locked loop. The output frequency of the clock generator is transmitted from the clock frequency feedback terminal h to the first frequency divider, then transmitted to the phase detection feedback terminal e of the phase detector after frequency division, and then phase-detected with the external reference clock signal at the phase detection reference signal input terminal c. A charge pump inside the phase detector outputs a voltage error signal from the phase detection output terminal d, and the loop filtering module filters an alternating-current component of the voltage error signal to obtain a control voltage, which is transmitted from the control voltage input terminal f to the clock generator to control the output frequency of the clock generator to realize synchronization of the external reference clock.

In addition, as shown in FIG. 2, the loop filtering module in the clock synchronization circuit may include a plurality of loop filters. An output terminal of each of the loop filters is connected to the first switch module, and the phase detection output terminal d of the phase detector is connected to an input terminal of each of the loop filters by means of the second switch module.

The control method includes:
controlling the first switch module to communicate with the digital-to-analog converter and the clock generator, so that the signal from the digital-to-analog converter is transmitted to the clock generator by means of the first switch module to realize synchronization of the internal reference clock; or
controlling the first switch module and the second switch module to communicate with a same one of the loop filters, so that the signal from the external reference signal processing module is transmitted to the clock generator by means of the first switch module to realize synchronization of the external reference clock.

Since the voltage control conversion module is provided with a plurality of loop filters, when the external reference clock needs to be synchronized, different loop filters can be selected by means of the first switch module and the second switch module to realize adjustable loop parameter hardware.

In addition, as shown in FIG. 3, the external reference signal processing module in the clock synchronization circuit includes a shaping and filtering module, a third switch module, and a plurality of second frequency dividers. The reference signal input terminal a of the external reference signal processing module is connected to the shaping and filtering module, and an output terminal of the shaping and filtering module is connected to input terminals of the plurality of second frequency dividers by means of the third switch module. The phase detector is provided with a plurality of phase detection reference signal input terminals c, and an output terminal of each of the second frequency dividers is connected to one of the phase detection reference signal input terminals c.

The control method includes:
controlling the first switch module to communicate with the digital-to-analog converter and the clock generator, so that the signal from the digital-to-analog converter is transmitted to the clock generator by means of the first switch module to realize synchronization of the internal reference clock; or
controlling the first switch module to communicate with the loop filtering module and the clock generator, and controlling the third switch module to communicate with the shaping and filtering module and one of the second frequency dividers, so that the signal from the external reference signal processing module is transmitted to the clock generator by means of the first switch module to realize synchronization of the external reference clock.

Due to the provision of the plurality of second frequency dividers and the third switch module, the third switch module can be controlled to switch to select a most appropriate channel for the signal to enter the phase detection reference signal input terminal c of the phase detector, so that a wider range of external reference frequencies can be synchronized.

In addition, as shown in FIG. 4, the loop filtering module in the clock synchronization circuit may include a plurality of loop filters, output terminals of the plurality of loop filters are all connected to the first switch module, and the phase detection output terminal d of the phase detector is connected to an input terminal of each of the loop filters by means of the second switch module. The external reference signal processing module in the clock synchronization circuit includes a shaping and filtering module, a third switch module, and a plurality of second frequency dividers. The reference signal input terminal a of the external reference signal processing module is connected to the shaping and filtering module, and an output terminal of the shaping and filtering module is connected to input terminals of the plurality of second frequency dividers by means of the third switch module. The phase detector is provided with a plurality of phase detection reference signal input terminals c, and an output terminal of each of the second frequency dividers is connected to one of the phase detection reference signal input terminals c.

The control method includes:
controlling the first switch module to communicate with the digital-to-analog converter and the clock generator, so that the signal from the digital-to-analog converter is transmitted to the clock generator by means of the first switch module to realize synchronization of the internal reference clock; or
controlling the first switch module and the second switch module to communicate with a same one of the loop filters, and controlling the third switch module to communicate with the shaping and filtering module and one of the second frequency dividers, so that the signal from the external reference signal processing module is transmitted to the clock generator by means of the first switch module to realize synchronization of the external reference clock.

The clock synchronization circuit in FIG. 4 has structural characteristics of both the clock synchronization circuit shown in FIG. 2 and the clock synchronization circuit shown in FIG. 3, and thus also has advantages of both the clock synchronization circuits shown in FIG. 2 and FIG. 3. That is, when the external reference clock needs to be synchronized, different loop filters can be selected by means of the first switch module and the second switch module to realize adjustable loop parameter hardware. Moreover, the third switch module can be controlled to switch to select a most appropriate channel for the signal to enter the phase detection reference signal input terminal c of the phase detector, so that a wider range of external reference frequencies can be synchronized.

According to another embodiment of the present disclosure, a printed circuit board is further provided. The printed circuit board includes the clock synchronization circuit in the above embodiment, that is, including the clock synchronization circuit shown in any one of FIG. 1 to FIG. 4.

In this embodiment, when the internal reference clock needs to be synchronized, the first switch module is controlled to switch to be communicated with the digital-to-analog converter and the control voltage input terminal f of the clock generator, and the digital-to-analog converter can output a control voltage corresponding to the internal reference clock to the clock generator to control an output frequency of the clock generator. When the external reference clock needs to be synchronized, the first switch module is controlled to switch to be communicated with the loop filtering module and the control voltage input terminal f of the clock generator. An external reference clock signal enters the external reference signal processing module from the reference signal input terminal a and is transmitted from the reference signal output terminal b to the phase detection reference signal input terminal c of the phase detector. The phase detector, the loop filtering module, the clock generator, and the first frequency divider form a phase locked loop.

The output frequency of the clock generator is transmitted from the clock frequency feedback terminal h to the first frequency divider, then transmitted to the phase detection feedback terminal e of the phase detector after frequency division, and then phase-detected with the external reference clock signal at the phase detection reference signal input terminal c. A charge pump inside the phase detector outputs a voltage error signal from the phase detection output terminal d, and the loop filtering module filters an alternating-current component of the voltage error signal to obtain a control voltage, which is transmitted from the control voltage input terminal f to the clock generator to control the output frequency of the clock generator. The clock synchronization circuit can realize switching of the internal and external reference clocks with fewer clock generator devices, thereby reducing an area of the printed circuit board and saving costs.

According to another embodiment of the present disclosure, a communication device is further provided. The communication device includes the clock synchronization circuit in the above embodiment or the printed circuit board in the above embodiment.

According to embodiments of the present disclosure, a clock synchronization circuit, a control method for a clock synchronization circuit, a printed circuit board, and a communication device are provided. When the internal reference clock needs to be synchronized, the first switch module is controlled to switch to be communicated with the digital-to-analog converter and the control voltage input terminal f of the clock generator, the digital-to-analog converter can output a control voltage corresponding to the internal reference clock to the clock generator to control an output frequency of the clock generator. When the external reference clock needs to be synchronized, the first switch module is controlled to switch to be communicated with the loop filtering module and the control voltage input terminal f of the clock generator. An external reference clock signal enters the external reference signal processing module from the reference signal input terminal a and is transmitted from the reference signal output terminal b to the phase detection reference signal input terminal c of the phase detector. The phase detector, the loop filtering module, the clock generator, and the first frequency divider form a phase locked loop. The output frequency of the clock generator is transmitted from the clock frequency feedback terminal h to the first frequency divider, then transmitted to the phase detection feedback terminal e of the phase detector after frequency division, and then phase-detected with the external reference clock signal at the phase detection reference signal input terminal c. A charge pump inside the phase detector outputs a voltage error signal from the phase detection output terminal d, and the loop filtering module filters an alternating-current component of the voltage error signal to obtain a control voltage, which is transmitted from the control voltage input terminal f to the clock generator to control the output frequency of the clock generator. The clock synchronization circuit can realize switching of the internal and external reference clocks with fewer clock generator devices, thereby reducing an area of the printed circuit board and saving costs.

The above is a specific description of some implementations of the present disclosure, but the present disclosure is not limited to the above implementations. Those skilled in the art can also make various equivalent variations or replacements without departing from the scope of the present disclosure, all of which are included in the scope defined by the claims of the present disclosure.

What is claimed is:

1. A clock synchronization circuit, comprising:
an external reference signal processing module, provided with a reference signal input terminal and a reference signal output terminal;
a phase detector, provided with a phase detection reference signal input terminal, a phase detection output terminal, and a phase detection feedback terminal, the phase detection reference signal input terminal being connected to the reference signal output terminal;
a voltage control conversion module, comprising a digital-to-analog converter, a loop filtering module, and a first switch module, the first switch module being provided with a first switch input terminal, second switch input terminals and a first switch output terminal, the digital-to-analog converter being connected to the first switch input terminal, and the phase detection output terminal being connected to the second switch input terminal by means of the loop filtering module;
a clock generator, provided with a control voltage input terminal, a clock frequency output terminal, and a clock frequency feedback terminal, the first switch output terminal being connected to the control voltage input terminal; and
a first frequency divider, the clock frequency feedback terminal being connected to the phase detection feedback terminal by means of the first frequency divider.

2. The clock synchronization circuit of claim 1, wherein the loop filtering module comprises a plurality of loop filters, and the number of the second switch input terminals corresponds to the number of the loop filters;
the voltage control conversion module further comprises a second switch module, the second switch module being provided with a third switch input terminal and second switch output terminals, the third switch input terminal being connected to the phase detection output terminal, the number of the second switch output terminals corresponding to the number of the loop filters, and the second switch output terminal being connected to the second switch input terminal by means of the loop filter.

3. The clock synchronization circuit of claim 1, wherein the external reference signal processing module comprises a shaping and filtering module and a second frequency divider which are sequentially connected, the reference signal input terminal is connected to the shaping and filtering module, and the second frequency divider is connected to the reference signal output terminal.

4. The clock synchronization circuit of claim 3, wherein the external reference signal processing module comprises a plurality of second frequency dividers, and the number of the phase detection reference signal input terminals corresponds to the number of the second frequency dividers;
the external reference signal processing module further comprises a third switch module, the third switch module being provided with a fourth switch input terminal and third switch output terminals, an output terminal of the shaping and filtering module being connected to the fourth switch input terminal, the number of the third switch output terminals corresponding to the number of the second frequency dividers, and the third switch output terminal being connected to the phase detection reference signal input terminal by means of the second frequency divider.

5. A control method for a clock synchronization circuit, the clock synchronization circuit comprising an external reference signal processing module, a phase detector, a voltage control conversion module, a clock generator and a first frequency divider, the voltage control conversion module comprising a digital-to-analog converter, a loop filtering module and a first switch module, the external reference signal processing module, the phase detector, the loop filtering module, the first switch module and the clock generator being sequentially connected, the digital-to-analog converter being connected to the first switch module, and the clock generator being further connected to the phase detector by means of the first frequency divider; and the control method comprising:

controlling the first switch module to switch, so that a signal from the digital-to-analog converter or a signal from the external reference signal processing module is transmitted to the clock generator by means of the first switch module to realize synchronization of an internal reference clock or synchronization of an external reference clock.

6. The control method for a clock synchronization circuit of claim 5, wherein the loop filtering module comprises a plurality of loop filters, the voltage control conversion module further comprises a second switch module, the phase detector is connected to the second switch module, and the second switch module is connected to the first switch module by means of the plurality of loop filters; and wherein controlling the first switch module to switch, so that a signal from the digital-to-analog converter or a signal from the external reference signal processing module is transmitted to the clock generator by means of the first switch module to realize synchronization of an internal reference clock or an external reference clock comprises:

controlling the first switch module to communicate with the digital-to-analog converter and the clock generator, so that the signal from the digital-to-analog converter is transmitted to the clock generator by means of the first switch module to realize synchronization of the internal reference clock; or controlling the first switch module and the second switch module to communicate with a same one of the loop filters, so that the signal from the external reference signal processing module is transmitted to the clock generator by means of the first switch module to realize synchronization of the external reference clock.

7. The control method for a clock synchronization circuit of claim 5, wherein the external reference signal processing module comprises a shaping and filtering module, a third switch module, and a plurality of second frequency dividers, the shaping and filtering module being connected to the third switch module, and the third switch module being connected to the phase detector by means of the plurality of second frequency dividers; and wherein controlling the first switch module to switch, so that a signal from the digital-to-analog converter or a signal from the external reference signal processing module is transmitted to the clock generator by means of the first switch module to realize synchronization of an internal reference clock or an external reference clock comprises:

controlling the first switch module to communicate with the digital-to-analog converter and the clock generator, so that the signal from the digital-to-analog converter is transmitted to the clock generator by means of the first switch module to realize synchronization of the internal reference clock; or controlling the first switch module to communicate with the loop filtering module and the clock generator, and controlling the third switch module to communicate with the shaping and filtering module and one of the second frequency dividers, so that the signal from the external reference signal processing module is transmitted to the clock generator by means of the first switch module to realize synchronization of the external reference clock.

8. The control method for a clock synchronization circuit of claim 5, wherein the loop filtering module comprises a plurality of loop filters, the voltage control conversion module further comprises a second switch module, the phase detector is connected to the second switch module, and the second switch module is connected to the first switch module by means of the plurality of loop filters;

the external reference signal processing module comprises a shaping and filtering module, a third switch module, and a plurality of second frequency dividers, the shaping and filtering module being connected to the third switch module, and the third switch module being connected to the phase detector by means of the plurality of second frequency dividers; and wherein controlling the first switch module to switch, so that a signal from the digital-to-analog converter or a signal from the external reference signal processing module is transmitted to the clock generator by means of the first switch module to realize synchronization of an internal reference clock or an external reference clock comprises:

controlling the first switch module to communicate with the digital-to-analog converter and the clock generator, so that the signal from the digital-to-analog converter is transmitted to the clock generator by means of the first switch module to realize synchronization of the internal reference clock; or controlling the first switch module and the second switch module to communicate with a same one of the loop filters, and controlling the third switch module to communicate with the shaping and filtering module and one of the second frequency dividers, so that the signal from the external reference signal processing module is transmitted to the clock generator by means of the first switch module to realize synchronization of the external reference clock.

9. A printed circuit board, comprising a clock synchronization circuit, the clock synchronization circuit comprising:

an external reference signal processing module, provided with a reference signal input terminal and a reference signal output terminal;

a phase detector, provided with a phase detection reference signal input terminal, a phase detection output terminal, and a phase detection feedback terminal, the phase detection reference signal input terminal being connected to the reference signal output terminal;

a voltage control conversion module, comprising a digital-to-analog converter, a loop filtering module, and a first switch module, the first switch module being provided with a first switch input terminal, second switch input terminals and a first switch output terminal, the digital-to-analog converter being connected to the first switch input terminal, and the phase detection output terminal being connected to the second switch input terminal by means of the loop filtering module;

a clock generator, provided with a control voltage input terminal, a clock frequency output terminal, and a clock frequency feedback terminal, the first switch output terminal being connected to the control voltage input terminal; and a first frequency divider, the clock frequency feedback terminal being connected to the phase detection feedback terminal by means of the first frequency divider.

10. A communication device, comprising the clock synchronization circuit of claim 1.

11. The clock synchronization circuit of claim 2, wherein the external reference signal processing module comprises a shaping and filtering module and a second frequency divider which are sequentially connected, the reference signal input terminal is connected to the shaping and filtering module, and the second frequency divider is connected to the reference signal output terminal.

12. The clock synchronization circuit of claim 11, wherein the external reference signal processing module comprises a plurality of second frequency dividers, and the number of the phase detection reference signal input terminals corresponds to the number of the second frequency dividers;

the external reference signal processing module further comprises a third switch module, the third switch module being provided with a fourth switch input terminal and third switch output terminals, an output terminal of the shaping and filtering module being connected to the fourth switch input terminal, the number of the third switch output terminals corresponding to the number of the second frequency dividers, and the third switch output terminal being connected to the phase detection reference signal input terminal by means of the second frequency divider.

13. A communication device, comprising the clock synchronization circuit of claim 9.

* * * * *